(12) United States Patent
Hudson et al.

(10) Patent No.: US 10,781,532 B2
(45) Date of Patent: Sep. 22, 2020

(54) METHODS FOR DETERMINING THE RESISTIVITY OF A POLYCRYSTALLINE SILICON MELT

(71) Applicant: Global Wafers Co., Ltd., Hsinchu (TW)

(72) Inventors: Carissima Marie Hudson, St. Charles, MO (US); JaeWoo Ryu, Chesterfield, MO (US); Richard J. Phillips, St. Peters, MO (US); Robert Standley, Chesterfield, MO (US); HyungMin Lee, Cheonan-si (KR); YoungJung Lee, Cheonan-si (KR)

(73) Assignee: GlobalWafers Co., Ltd., Hsinchu (TW)

( * ) Notice: Subject to any disclaimer, the term of this patent is extended or adjusted under 35 U.S.C. 154(b) by 124 days.

(21) Appl. No.: 16/020,695

(22) Filed: Jun. 27, 2018

(65) Prior Publication Data
US 2020/0002835 A1 Jan. 2, 2020

(51) Int. Cl.
*C30B 15/20* (2006.01)
*C30B 15/04* (2006.01)
*C30B 29/06* (2006.01)

(52) U.S. Cl.
CPC .............. *C30B 15/04* (2013.01); *C30B 15/20* (2013.01); *C30B 29/06* (2013.01)

(58) Field of Classification Search
CPC .. C30B 1/00; C30B 1/03; C30B 15/00; C30B 15/02; C30B 15/20
See application file for complete search history.

(56) References Cited

U.S. PATENT DOCUMENTS

| 5,449,883 | A | * | 9/1995 | Tsuruta | ............... H01L 21/6776 |
| | | | | | 219/483 |
| 5,505,157 | A | * | 4/1996 | Hara | ....................... C30B 29/06 |
| | | | | | 117/2 |
| 8,317,919 | B2 | | 11/2012 | Bender | |
| 2006/0263967 | A1 | | 11/2006 | Falster et al. | |
| 2017/0176105 | A1 | * | 6/2017 | Dubois | .................. C30B 29/06 |

FOREIGN PATENT DOCUMENTS

| CN | 102181919 A | 9/2011 |
| JP | S6395629 A | 4/1988 |
| JP | 2012129308 A | 7/2012 |
| WO | 2018125958 A1 | 7/2018 |

OTHER PUBLICATIONS

ASTM International: "Standard Test Method for Resistivity of Silicon Bars Using a Two-Point Probe", Designation F 397-02, 11 pgs, available before Jun. 27, 2018.
ASTM International: "Test Methods for Conductivity Type of Extrinsic Semiconducting Materials", Edition SEMI MF42-1105, 2005, 9 pgs.
U.S. Appl. No. 16/020,698 entitled, Sample Rod Growth and Resistivity Measurement During Single Crystal Silicon Ingot Production, filed Jun. 27, 2018, 23 pgs.

* cited by examiner

*Primary Examiner* — Robert M Kunemund
(74) *Attorney, Agent, or Firm* — Armstrong Teasdale LLP

(57) ABSTRACT

Methods for forming single crystal silicon ingots with improved resistivity control. The methods involve growth and resistivity measurement of a sample rod. The sample rod may have a diameter less than the diameter of the product ingot. The resistivity of the sample rod may be measured directly by contacting a resistivity probe with a planar segment formed on the sample rod. The sample rod may be annealed in a thermal donor kill cycle prior to measuring the resistivity.

19 Claims, 6 Drawing Sheets

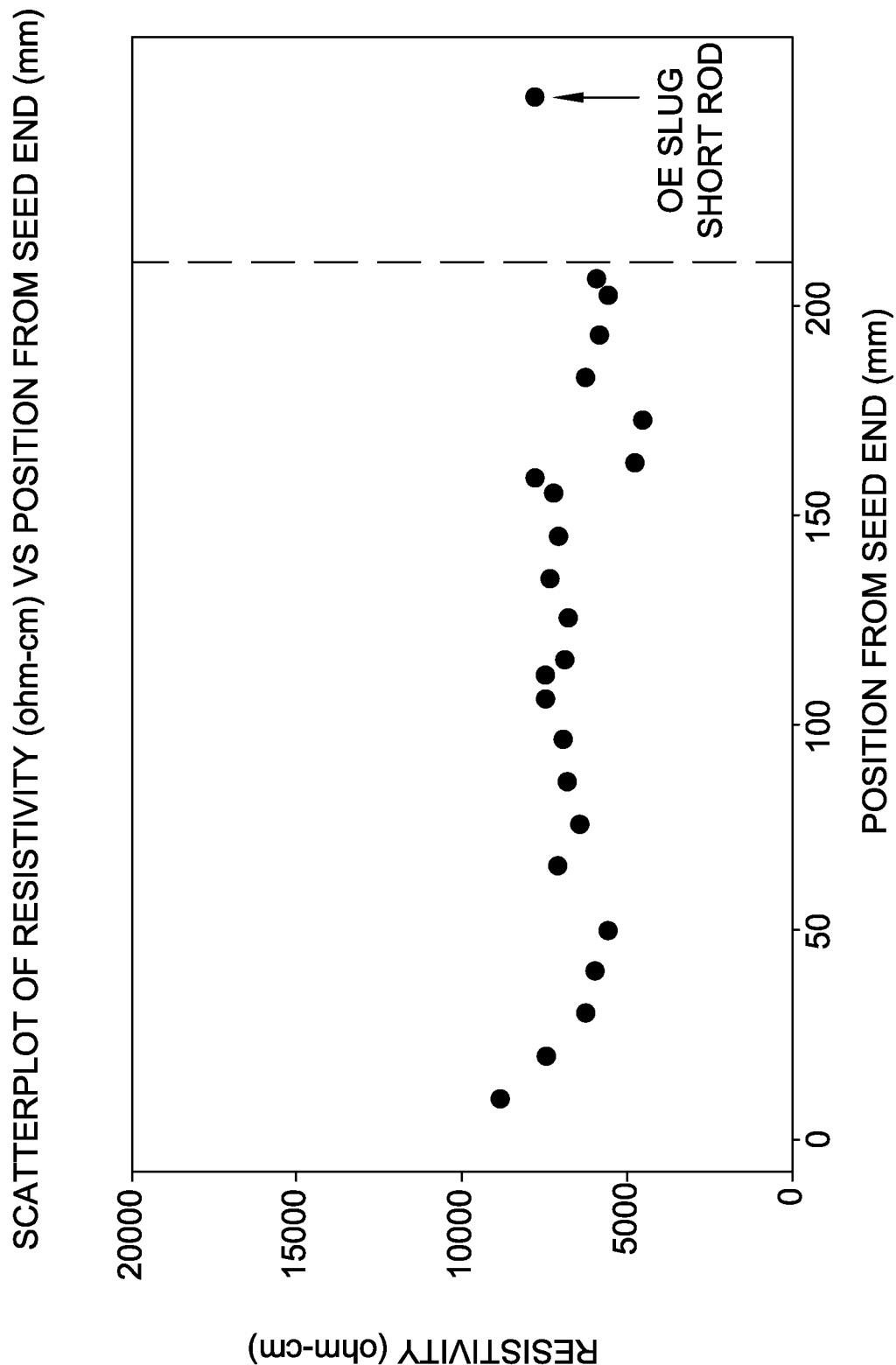

METHODS FOR DETERMINING THE RESISTIVITY OF A POLYCRYSTALLINE SILICON MELT

FIELD OF THE DISCLOSURE

The field of the disclosure relates to methods for forming single crystal silicon ingots with improved resistivity control and, in particular, methods that involve growth and resistivity measurement of a sample rod. In some embodiments, the sample rod has a diameter less than the diameter of the product ingot.

BACKGROUND

Single crystal silicon, which is the starting material for most processes for the fabrication of semiconductor electronic components, is commonly prepared by the so-called Czochralski (CZ) process wherein a single seed crystal is immersed into molten silicon and then grown by slow extraction. Molten silicon is contaminated with various impurities, among which is mainly oxygen, during the time it is contained in a quartz crucible. Some applications, such as advanced wireless communication applications, insulated gate bipolar transistors (IGBT) and low power, low leakage devices, require wafers with a relatively high resistivity such as 1500 ohm-cm ($\Omega$-cm) or more.

Highly pure polysilicon is used for high resistivity ingot production. Highly pure polysilicon is characterized by a spread in the impurity profile which causes a wide spread in the intrinsic resistivity range of the un-doped material and its type. Targeting of the seed-end resistivity in such high or ultra-high resistivity materials is difficult due to the variability of boron and phosphorous in the starting material (including surface boron and phosphorous in the polysilicon material) and due to impurities in the crucible, and/or oxygen levels which alter the resistivity after a thermal donor kill cycle. Further, such high resistivity applications may be susceptible to increased error in resistivity measurement.

A need exists for methods for preparing high resistivity silicon ingots that allow the impurity concentration and/or resistivity of the polysilicon starting material to be sampled relatively quickly and/or that allow the resistivity to be measured relatively quickly with a relatively small amount of silicon being consumed for resistivity measurement and/or that allow for better resistivity control and/or that simplify extrinsic doping processes.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for producing a single crystal silicon ingot from a silicon melt held within a crucible. Polycrystalline silicon is added to the crucible. The polycrystalline silicon is heated to cause a silicon melt to form in the crucible. A sample rod is pulled from the melt. The sample rod has a diameter. The sample rod is annealed to annihilate thermal donors. A resistivity of the sample rod is measured after annihilation of thermal donors. A product ingot is pulled from the melt. The product ingot has a diameter. The diameter of the sample rod is less than the diameter of the product ingot.

Another aspect of the present disclosure is directed to a method for determining the resistivity of a polycrystalline silicon melt held within a crucible. A sample rod is pulled from the melt. The sample rod is annealed in a thermal donor kill cycle. A current is applied to the sample rod. The sample rod is contacted with a resistivity probe while applying current to the sample rod to measure the resistivity of the rod.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

FIG. 6 is a scatter plot of the resistivity of a sample rod at various positions from the seed end.

Corresponding reference characters indicate corresponding parts throughout the drawings.

DETAILED DESCRIPTION

Provisions of the present disclosure are directed to methods for producing a single crystal silicon ingot by the Czochralski method in which a sample rod is grown to determine the resistivity of the melt. The sample rod has a diameter less than the product ingot.

Figure 1:
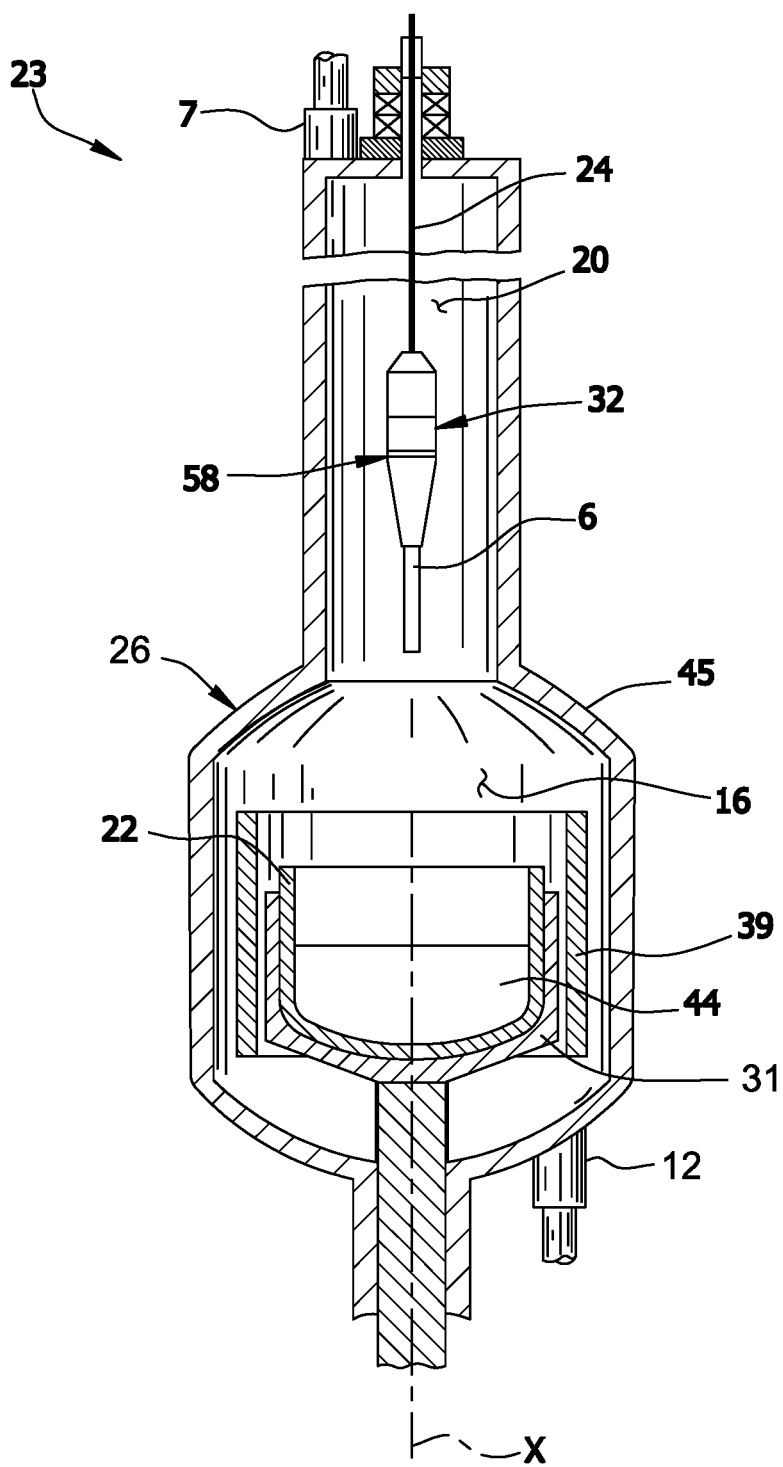
FIG. 1 is a schematic side view of a pulling apparatus for forming a single crystal silicon ingot.

In accordance with embodiments of the present disclosure and with reference to FIG. 1, the product ingot is grown by the so-called Czochralski process in which the ingot is withdrawn from a silicon melt 44 held within a crucible 22 of an ingot puller 23. The ingot puller 23 includes a housing 26 that defines a crystal growth chamber 16 and a pull chamber 20 having a smaller transverse dimension than the growth chamber. The growth chamber 16 has a generally dome shaped upper wall 45 transitioning from the growth chamber 16 to the narrowed pull chamber 20. The ingot puller 23 includes an inlet port 7 and an outlet port 12 which may be used to introduce and remove a process gas to and from the housing 26 during crystal growth.

The crucible 22 within the ingot puller 23 contains the silicon melt 44 from which a silicon ingot is drawn. The silicon melt 44 is obtained by melting polycrystalline silicon charged to the crucible 22. The crucible 22 is mounted on a turntable 31 for rotation of the crucible 22 about a central longitudinal axis X of the ingot puller 23.

A heating system 39 (e.g., an electrical resistance heater) surrounds the crucible 22 for melting the silicon charge to produce the melt 44. The heater 39 may also extend below the crucible as shown in U.S. Pat. No. 8,317,919. The heater 39 is controlled by a control system (not shown) so that the temperature of the melt 44 is precisely controlled throughout the pulling process. Insulation (not shown) surrounding the heater 39 may reduce the amount of heat lost through the housing 26. The ingot puller 23 may also include a heat shield assembly (not shown) above the melt surface for shielding the ingot from the heat of the crucible 22 to increase the axial temperature gradient at the solid-melt interface.

A pulling mechanism (not shown) is attached to a pull wire 24 that extends down from the mechanism. The mechanism is capable of raising and lowering the pull wire 24. The ingot puller 23 may have a pull shaft rather than a wire, depending upon the type of puller. The pull wire 24 terminates in a pulling assembly 58 that includes a seed crystal chuck 32 which holds a seed crystal 6 used to grow the silicon ingot. In growing the ingot, the pulling mechanism lowers the seed crystal 6 until it contacts the surface of the silicon melt 44. Once the seed crystal 6 begins to melt, the pulling mechanism slowly raises the seed crystal up through the growth chamber 16 and pull chamber 20 to grow the monocrystalline ingot. The speed at which the pulling mechanism rotates the seed crystal 6 and the speed at which the pulling mechanism raises the seed crystal (i.e., the pull rate v) are controlled by the control system.

A process gas is introduced through the inlet port 7 into the housing 26 and is withdrawn from the outlet port 12. The process gas creates an atmosphere within the housing 26 and the melt and atmosphere form a melt-gas interface. The outlet port 12 is in fluid communication with an exhaust system (not shown) of the ingot puller.

In this regard, the ingot puller 23 shown in FIG. 1 and described herein is exemplary and other crystal puller configurations and arrangements may be used to pull a single crystal silicon ingot from a melt unless stated otherwise.

Figure 2:
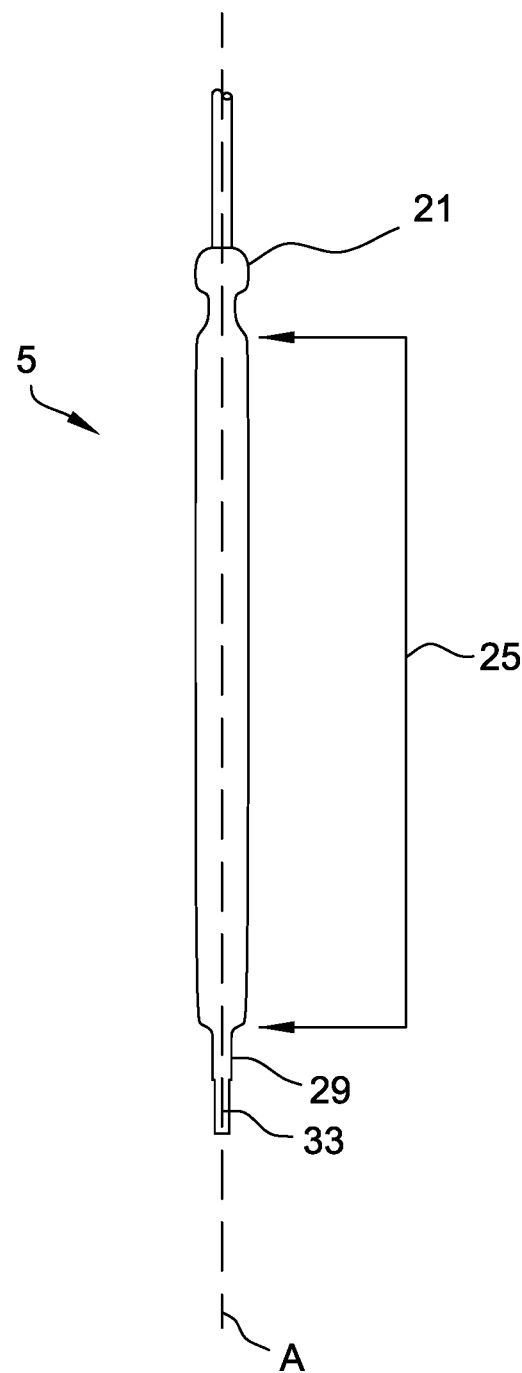
FIG. 2 is a sample rod grown from a silicon melt.

In accordance with embodiments of the present disclosure, after polycrystalline silicon is added to the crucible 22 and the heating system 39 is operated to melt-down the polycrystalline silicon, a sample ingot or rod is pulled from the melt. An example sample rod 5 is shown in FIG. 2. The rod 5 includes a crown portion 21 in which the rod transitions and tapers outward from the seed to reach a target diameter. The rod 5 includes a constant diameter portion 25 or cylindrical main body or simply "body", of the crystal which is grown by increasing the pull rate. The main body 25 of the sample rod 5 has a relatively constant diameter. The rod 5 includes a tail or end-cone 29 in which the rod tapers in diameter after the main body 25. When the diameter becomes small enough, the rod is then separated from the melt. The rod 5 has a central longitudinal axis A that extends through the crown 21 and a terminal end 33 of the ingot.

The growth conditions of the sample rod 5 may be selected from generally any of the suitable growth conditions available to those of skill in the art. The sample rod 5 may be grown with a locked seed lift (i.e., fixed pull speed with varying diameter such as +/−about 5 mm) or active seed lift (pull speed varied to maintain target diameter).

The sample rod 5 has a diameter less than the product ingot that is grown after the sample rod. For example, the diameter of the sample rod may be less than 0.75 times the times the diameter of the product ingot, less than 0.50 times, less than about 0.25 times or less than 0.1 times the diameter of the product ingot. In some embodiments, the diameter of the sample rod is less than about 150 mm or less than about 100 mm, less than about 50 mm, less than about 25 mm, or less than about 20 mm (e.g., from about 5 mm to about 150 mm, from about 5 mm to about 100 mm, from about 5 mm to about 50 mm, from about 5 mm to about 25 mm or from about 10 mm to about 25 mm). Generally, the diameter of the rod 5 is measured by measuring the rod along several axial locations (e.g., within a constant diameter portion of the rod if the rod has a crown and/or tapered end) and averaging the measured diameters (e.g., measuring 2, 4, 6, 10 or more diameters across the length and averaging). In some embodiments, the largest diameter of the sample of the rod is less than about 150 mm or less than about 100 mm, less than about 50 mm, less than about 25 mm, or less than about 20 mm (e.g., from about 5 mm to about 150 mm, from about 5 mm to about 100 mm, from about 5 mm to about 50 mm, from about 5 mm to about 25 mm or from about 10 mm to about 25 mm).

In some embodiments, the rod 5 has a diameter that generally corresponds to the diameter of the neck portion of a product ingot grown in the crystal puller. For example, the rod may have a diameter of less than 50 mm, less than 25 mm, or less than 20 mm.

The sample rod 5 may have any suitable length. In some embodiments, the rod (e.g., after cropping) has a length of less than about 300 mm, less than about 200 mm or less than about 100 mm (e.g., about 25 mm to about 300 mm).

After the sample rod 5 is grown, the resistivity of the sample rod 5 is measured. The rod 5 is removed from the ingot puller 23 and is processed to allow the resistivity to be measured. The crown and tail of the ingot may be removed, such as by use of a wire saw. In some embodiments, the cropped ends of the rod 5 are ground to flatten the ends. The rod ends may be etched (e.g., mixed acid etched). The rod 5 may be modified to include ohmic contacts such as ohmic contacts at its first and second ends 15, 17. For example, the cut ends 15, 17 of the rod 5 may be painted with a colloidal silver paint and dried.

Figure 3:
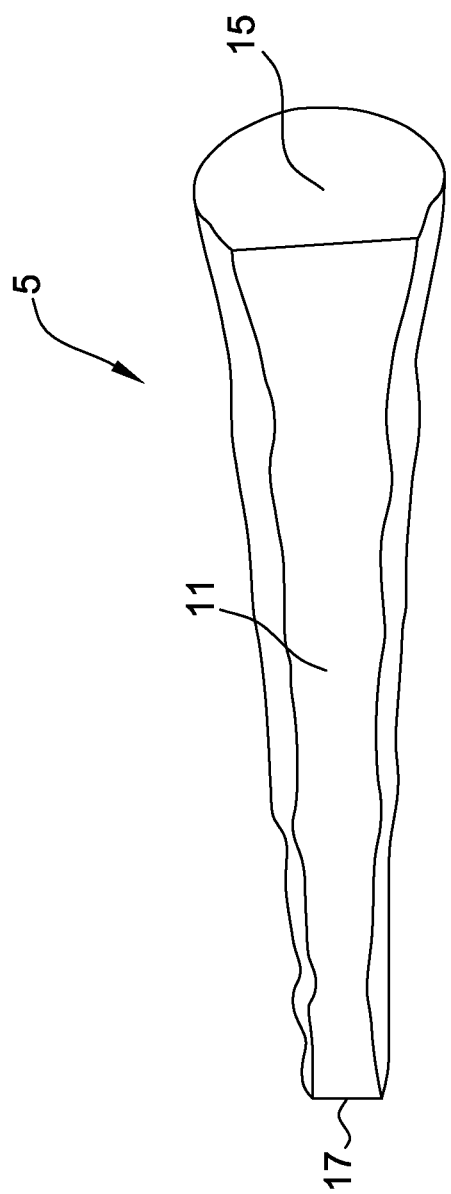
FIG. 3 is the sample rod with a planar segment formed on its surface.

A planar segment 11 (FIG. 3) is formed on a surface of the rod 5. The planar segment 11 may extend axially along the rod 5. In some embodiments, the planar segment 11 extends axially from the first end 15 to the second end 17 of the rod 5. In other embodiments, the planar segment 11 extends only partially along its length.

The planar segment 11 may be formed by grinding a surface of the sample rod 5 such as by use of a grinding pad (e.g., diamond grit pad). In some embodiments, the planar segment has a width sufficient to allow contact with a voltage probe (e.g., about 2-4 mm). The planar segment 11 may be cleaned such as by washing with deionized water and drying before resistivity measurement.

In some embodiments, the sample rod 5 is subjected to a rapid thermal anneal before measuring the resistivity. The rapid thermal anneal may act as a thermal donor kill cycle (i.e., annihilation of thermal donors) by dissociating interstitial oxygen clusters. In some embodiments, the anneal is at a temperature of about 500° C. or more, about 650° C. or more or about 800° C. or more (e.g., 500° C. to about 1000° C., from about 500° C. to about 900° C. or from about 650° C. to about 1100° C.) for at least about 5 seconds, at least about 30 seconds, at least about 1 minute or at least about 3 minutes or more (e.g., from about 5 seconds to 15 minutes, from about 5 seconds to about 5 minutes or from about 5 seconds to about 3 minutes).

The resistivity of the rod 5 may be measured from the planar segment 11. In some embodiments of the present disclosure, current is driven through the rod 5 and a resistivity probe is contacted at one or more locations along the length of rod 5. Current may be applied to the rod 5 through one of the ends 15, 17.

Figure 4:
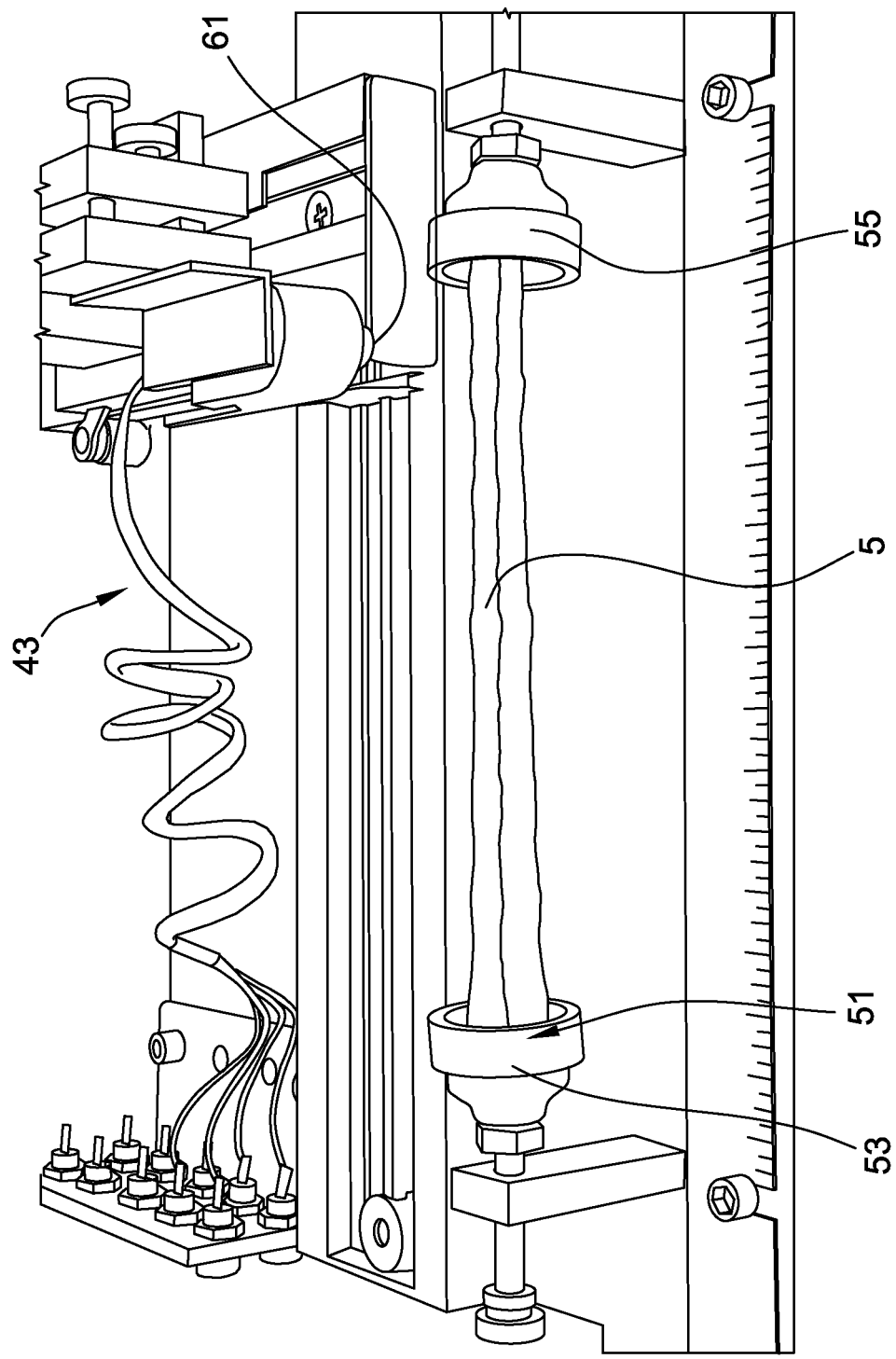
FIG. 4 is a measurement apparatus for measuring the resistivity of the sample rod.

In some embodiments, the rod 5 is secured within a measurement apparatus such as the apparatus 43 shown in FIG. 4. The measurement apparatus 43 includes a clamp 51 that secures the rod 5. The clamp 51 has a first support 53 that secures the rod 5 toward its first end 15 and a second support 55 that secures the rod 5 toward its second end 17. The supports 53, 55 are configured to secure the rod between the supports 53, 55 (e.g., threaded for adjustment and clamping). The supports 53, 55 may contact ohmic contacts on the cropped ends of the rod 5. A probe tip 61 is caused to contact the rod 5 on the flat planar segment of the rod. Current is passed through the supports 53, 55 and the voltage is measured by the probe tip 61. The probe tip 61 is moved manually down the axis of the rod 5 with current applied/voltage being measured at each point. In the illustrated apparatus 43, the probe tip 61 is moved manually. In other embodiments, the probe tip 61 is moved by actuators.

The measurement apparatus 43 of FIG. 4 is an example apparatus and any suitable apparatus for securing and/or measuring the resistivity of the rod may be used unless stated otherwise. Use of a rod (e.g., generally s narrow diameter rod such as less than 100 mm, 50 mm or less than 25 mm) and the measurement apparatus 43 allows the resistivity to be measured without slicing the rod into wafers or slugs.

The resistivity probe may be a two point probe in which both probe tips are contacted with the planar segment 11. The voltage difference is measured across the two probe tips. For example, resistivity may be measured with a two-point probe in accordance with SEMI Standard MF397-0812, entitled "Test Method for Resistivity of Silicon Bars using a Two-Point Probe," which is incorporated herein by reference for all relevant and consistent purposes. The 2-terminal or 3-terminal rectification method may be used to determine the crystal type (i.e., N-type or P-type). Such type determination may be performed in accordance with SEMI Standard MF42-0316, entitled "Test Method for Conductivity Type of Extrinsic Semiconducting Materials", which is incorporated herein by reference for all relevant and consistent purposes. Both 2-terminal and 3-terminal rectification methods are robust methods for very high resistivity silicon.

The voltage may be measured at various points across the length. The measured voltages and the sample length and average diameter may be used to calculate the resistivity such as by determining the slope of a current-voltage curve (e.g., Example 1 below).

In some embodiments, the sample rod 5 has a relatively low oxygen content such as an oxygen content of less than about 5.5 ppma. In other embodiments, the oxygen content of the sample rod is less than 5.2 ppma, less than 5.0 ppma, less than 3.5 ppma, less than about 3 ppma or even less than about 2.5 ppma. In some embodiments, the sample rod 5 is free of dislocations.

The measured resistivity of the rod 5 provides information related to the resistivity of the polycrystalline silicon melt in the crucible (i.e., the starting dopant impurity concentration (i.e., net donor-acceptor concentration)). The measured resistivity of the rod 5 may be used to adjust the manufacturing conditions for the subsequently grown ingot. For example, an amount of dopant may be added to the polycrystalline silicon melt with the amount of dopant being adjusted based at least in part on the measured resistivity (e.g., by use of a model that predicts product ingot resistivity). Suitable dopants include p-type dopants such as boron, aluminum, gallium and indium and n-type dopants such as phosphorous, arsenic and antimony.

In some embodiments, an amount of dopant is added to the melt before growing the sample rod and measuring the resistivity of the rod and an amount of dopant (e.g., the same dopant or a different dopant) is added after the sample rod is grown. In other embodiments, all dopants (if any) are added after the sample rod is grown and the resistivity is measured (e.g., boron or phosphorous).

The polysilicon to which the dopant is added and from which a sample ingot and product ingot is pulled may be semiconductor grade polysilicon. When semiconductor grade polysilicon is used, in some embodiments the polysilicon has a resistivity greater than 4,000 Ω-cm and contains no more than 0.02 ppba boron or phosphorous.

After the sample rod is pulled and, optionally, dopant is added to the melt, a product ingot is withdrawn from the melt. The product ingot has a diameter greater than the diameter of the sample rod (i.e., the diameter of the constant diameter portion of the sample rod is less than the diameter of the constant diameter portion of the ingot). The product ingot may have a diameter of about 150 mm or, as in other embodiments, about 200 mm, about 300 mm or more (e.g., 450 mm or more).

In some embodiments, polycrystalline silicon is not added during the growth of the ingot (e.g., as in a batch process). In other embodiments, polycrystalline silicon is added to the melt as the product ingot is grown (e.g., as in a continuous Czochralski method)

The amount of dopant added to the melt (with or without addition of a first dopant before the sample rod is grown) may be controlled to achieve a target resistivity in at least a portion of the main body of the ingot (e.g., a prime portion of the ingot). In some embodiments, the target resistivity is a minimum resistivity. In some embodiments, the entire length of the ingot (e.g., length of the body of the ingot) has the target resistivity (e.g., minimum resistivity). In some embodiments, the target resistivity of at least a portion of the product ingot is a minimum resistivity of at least about 1,500 Ω-cm or, as in other embodiments, at least about 2,000 Ω-cm, at least about 4,000 Ω-cm, at least about 6,000 Ω-cm, at least about 8,000 Ω-cm, at least about 10,000 Ω-cm or from about 1,500 Ω-cm to about 50,000 ohm-cm or from about 8,000 Ω-cm to about 50,000 Ω-cm. Alternatively or in addition, the sample rod may have a resistivity of at least about 1,500 Ω-cm, or at least about 2,000 Ω-cm, at least about 4,000 Ω-cm, at least about 6,000 Ω-cm, at least about 8,000 Ω-cm, at least about 10,000 Ω-cm, from about 1,500 Ω-cm to about 50,000 ohm-cm or from about 8,000 Ω-cm to about 50,000 Ω-cm.

Compared to conventional methods for producing a single crystal silicon ingot, the methods of the present disclosure have several advantages. Relatively high purity polysilicon that is used to produce relatively high resistivity single crystal silicon has a wide spread in boron and phosphorous impurity amounts which causes a wide spread in the intrinsic resistivity. By growing a sample rod with relatively small diameter (e.g., less than the product ingot such as less than 100 mm, less than 50 mm, less than 25 mm or even less than 10 mm compared to sample ingots that have a size substantially the same of the product ingot such as at least 200 mm), the resistivity of the melt can be sampled relatively quickly. The measured resistivity may be used for more precise addition of dopant to achieve better targeting of high resistivity or ultra-high resistivity products (e.g., at least about 3000 ohm-cm, 5000 ohm-cm or at least 7000 ohm-cm or more) and, in particular, for better seed-end resistivity targeting. The relatively small diameter sample rod consumes relatively little amount of the melt (e.g., less than 1 kg, less than 0.5 kg or about 0.25 kg or less compared to a full diameter short ingot which may consume 15 kg, 20 kg or 50 kg or more of the melt) and reduces impurity build-up attributed to the sampling process. The sample rod may be grown relatively quickly (e.g., about 12, 10 or even 5 hours or less compared to a full size short ingot which may involve 20 hours, 30 hours, 40 hours, or 50 hours of growth time). The sample rod may have a relatively low oxygen content (e.g., such as less than about 5 ppma or less than 4 ppma) which may improve the accuracy of the resistivity measurement (e.g., the accuracy of the rod after a thermal donor kill cycle).

In embodiments in which a planar segment is formed on the surface of the sample rod, the resistivity may be measured by a two-point probe. Such two-point probes may reduce sample preparation, may be less sensitive to geometric correction factors and may allow for better current contacts relative to four-point probes. Use of a two-point probe also allows use of a 2-terminal or 3-terminal rectification method for type-determination of the ingot.

Reduced sample rod growth time and reduced resistivity measurement times reduce the processing time at which the resistivity measurement is provided (e.g., 20, 30 or 40 hours in reduction of process time) which reduces impurity buildup caused by crucible dissolution. Reducing impurities also improves resistivity predictability for future runs. Reduction in the hot hour time for each batch (i.e., between product ingots) allows for the crucible to recharged in additional cycles without an increase in loss of zero dislocation.

EXAMPLES

The processes of the present disclosure are further illustrated by the following Examples. These Examples should not be viewed in a limiting sense.

Example 1: Determination of Resistivity from I-V Curve

Figure 5:
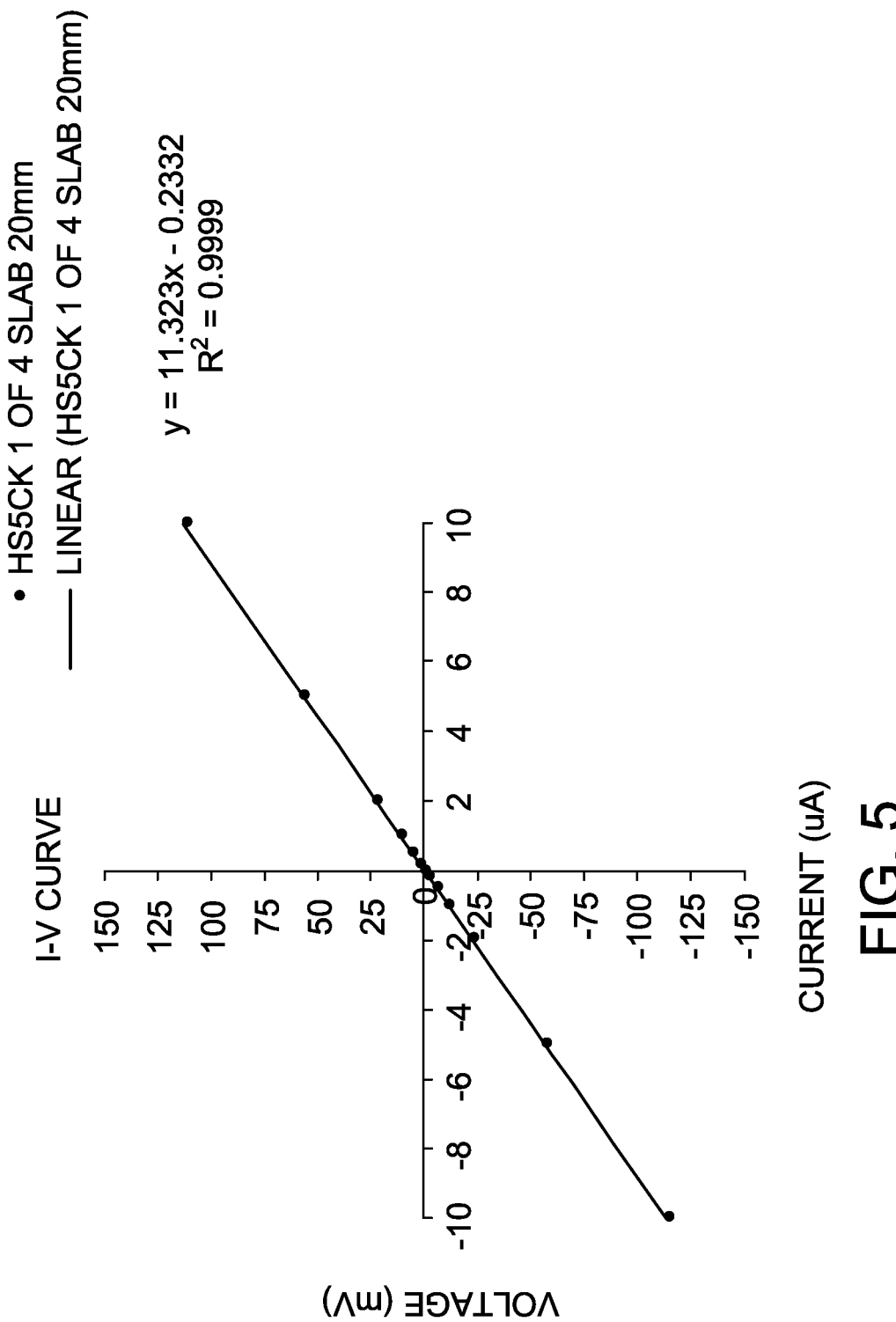
FIG. 5 is an I-V curve used to measure resistivity of a sample rod.

Voltage of a sample rod was measured axially (e.g., such as with the apparatus of FIG. 4) with the applied current and measured voltage being recorded. FIG. 5 shows the I-V curve that was generated. Using the geometry of the sample and the slope of the I-V curve, the resistivity was determined to be 6139 ohm-cm for the sample.

Example 2: Comparison of Short Ingot vs Sample Rod

A single crystal short sample ingot ("Short Ingot") having a diameter of about the size of the product rod (e.g., about 200 mm in a 200 mm pulling apparatus) was grown in a pulling apparatus similar to FIG. 1. The crystal was cropped and subjected to a mixed acid etch (MAE). The crystal slug was rapid thermal annealed at 800° C. for 3 minutes and lapped. The slug was contacted with a four-point probe to measure the resistivity with the resistivity being averaged over three measurements.

A sample rod ("Sample Rod") was grown in locked seed lift mode in the same pulling apparatus after the short ingot was grown. The diameter of the rod varied across its length and was within a range of 17-23 mm with an average of 20 mm. The sample rod was cropped and ground to form a flat segment that extended from one end to the other end of the rod. The rod was rapid thermal annealed at 800° C. for 3 minutes. The resistivity of the ingot was measured by a measurement apparatus similar to the apparatus shown in FIG. 4 and with a two-point probe. The differences between the growth conditions are shown in Table 1 below:

TABLE 1

Growth Conditions for Sample Ingot 200 mm in Diameter and a Sample Rod ~17-23 mm in Diameter

|  | Short Ingot | Sample Rod |
| --- | --- | --- |
| Diameter (mm) | 207 | ~17-23 |
| Weight (kg) | 31 | 0.11 |
| Length (mm) | 250 | 200 |
| Process Time (hr) | 25 | 5 |
| Resistivity Sample Preparation Time (hr) | 26 | 6 |
| Total time (hr) | 51 | 11 |

The measured resistivities across the length of the sample rod and the resistivity of a slug from the sample ingot are shown in FIG. 6.

The sample preparation time for the short ingot was 26 hours and involved cropping, mixed-acid etch, rapid thermal anneal, slab cutting, grinding (e.g., with a diamond pad), lapping and measurement with a 4-point probe. The sample preparation time for the sample rod was 6 hours and involved cropping, mixed-acid etch, rapid thermal anneal, flat grinding (with a diamond pad), lapping and measurement with a 2-point probe.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for determining the resistivity of a polycrystalline silicon melt held within a crucible, the method comprising:
    pulling a sample rod from the melt;
    annealing the sample rod in a thermal donor kill cycle;
    applying a current to the sample rod; and
    contacting the sample rod with a resistivity probe while applying current to the sample rod to measure the resistivity of the rod.

2. The method as set forth in claim 1 further comprising forming a planar segment on a surface of the sample rod, the resistivity probe contacting the planar segment to measure the resistivity of the rod.

3. The method as set forth in claim 1 wherein the probe is a two-point resistivity probe.

4. The method as set forth in claim 1 wherein the sample rod has an average diameter, the average diameter of the sample rod being less than about 150 mm.

5. The method as set forth in claim 1 wherein the sample rod has an average diameter, the average diameter of the sample rod being less than about 100 mm.

6. The method as set forth in claim 1 wherein the sample rod has an average diameter, the average diameter of the sample rod being less than about 50 mm.

7. The method as set forth in claim 1 wherein the sample rod has an average diameter, the average diameter of the sample rod being less than about 25 mm.

8. The method as set forth in claim 1 wherein the sample rod has a largest diameter, the largest diameter of the sample rod being less than about 150 mm.

9. The method as set forth in claim 1 wherein the sample rod has a largest diameter, the largest diameter of the sample rod being less than about 50 mm.

10. The method as set forth in claim 1 wherein the sample rod is secured by a measurement apparatus comprising a clamp that holds the sample rod when contacting the rod with a resistivity probe.

11. The method as set forth in claim 1 wherein the sample rod is annealed prior to measuring the resistivity of the sample rod.

12. The method as set forth in claim 1 further wherein the sample rod is annealed at a temperature of at least about 500° C.

13. The method as set forth in claim 12 wherein a length of the anneal is at least about 5 seconds.

14. The method as set forth in claim 12 wherein a length of the anneal is from about 5 seconds to about 5 minutes.

15. The method as set forth in claim 1 further wherein the sample rod is annealed at a temperature of at least about 650° C.

16. The method as set forth in claim 1 wherein the sample rod has a length of less than about 300 mm.

17. The method as set forth in claim 1 wherein the sample rod has a resistivity of at least about 1,500 Ω-cm.

18. The method as set forth in claim 1 wherein the sample rod has a resistivity of at least about 6,000 Ω-cm.

19. The method as set forth in claim 1 wherein the sample rod has a resistivity of at least about 10,000 Ω-cm.

* * * * *